(12) United States Patent
Li et al.

(10) Patent No.: US 11,387,815 B2
(45) Date of Patent: *Jul. 12, 2022

(54) APPARATUS AND METHOD FOR IMPROVING LOCK TIME

(71) Applicant: Intel Corporation, Santa Clara, CA (US)

(72) Inventors: William Li, Portland, OR (US); Mohsen Nasroullahi, Beaverton, OR (US); Khoa Nguyen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/119,937

(22) Filed: Dec. 11, 2020

(65) Prior Publication Data

US 2021/0143803 A1 May 13, 2021

Related U.S. Application Data

(63) Continuation of application No. 16/605,492, filed as application No. PCT/US2018/040349 on Jun. 29, 2018, now Pat. No. 10,868,523.

(Continued)

(51) Int. Cl.
| | |
|---|---|
| *H03K 3/03* | (2006.01) |
| *H03K 5/131* | (2014.01) |
| *H03K 5/133* | (2014.01) |
| *H03L 7/081* | (2006.01) |
| *H03L 7/087* | (2006.01) |
| *H03L 7/095* | (2006.01) |

(Continued)

(52) U.S. Cl.
CPC .......... *H03K 3/0315* (2013.01); *H03K 5/131* (2013.01); *H03K 5/133* (2013.01); *H03L 7/081* (2013.01); *H03L 7/087* (2013.01); *H03L 7/095* (2013.01); *H03L 7/0995* (2013.01); *H03L 7/1976* (2013.01)

(58) Field of Classification Search
CPC .................................................. H03K 3/0315
USPC ...................................................... 331/57, 2
See application file for complete search history.

(56) References Cited

U.S. PATENT DOCUMENTS

| | | | |
|---|---|---|---|
| 5,815,043 A | | 9/1998 | Chow et al. |
| 5,955,928 A | * | 9/1999 | Smith ............. H03L 7/087 331/2 |

(Continued)

FOREIGN PATENT DOCUMENTS

| | | |
|---|---|---|
| JP | 4435723 | 3/2010 |
| KR | 20080113625 | 12/2008 |

OTHER PUBLICATIONS

International Preliminary Report on Patentability for PCT Application No. PCT/US18/40349, dated Jan. 16, 2020.

(Continued)

*Primary Examiner* — Joseph Chang
(74) *Attorney, Agent, or Firm* — Schwabe, Williamson & Wyatt, P.C.

(57) ABSTRACT

An apparatus is provided to improve lock time of a phase locked loop, wherein the apparatus comprises: a ring oscillator including at least two delay stages, wherein each delay stage has a controllable delay; and a multiphase frequency monitor coupled to the ring oscillator to monitor frequency at an output of at least two delay stages of the ring oscillator.

16 Claims, 8 Drawing Sheets

Related U.S. Application Data

(60) Provisional application No. 62/530,063, filed on Jul. 7, 2017.

(51) Int. Cl.
*H03L 7/099* (2006.01)
*H03L 7/197* (2006.01)

(56) References Cited

U.S. PATENT DOCUMENTS

| | | | |
|---|---|---|---|
| 7,370,245 | B1 | 5/2008 | Verma et al. |
| 7,463,096 | B2 * | 12/2008 | Chi ................... G06F 1/3203 331/2 |
| 8,773,182 | B1 | 7/2014 | Degani et al. |
| 9,641,183 | B2 | 5/2017 | Wentzloff et al. |
| 2003/0030473 | A1 | 2/2003 | Lee |
| 2003/0042985 | A1 | 3/2003 | Shibahara et al. |
| 2005/0046452 | A1 | 3/2005 | Briones |
| 2010/0308871 | A1 | 12/2010 | Helio et al. |
| 2012/0319747 | A1 | 12/2012 | Namdar-Mehdiabadi et al. |
| 2013/0043919 | A1 | 2/2013 | Kitagawa |
| 2015/0214955 | A1 | 7/2015 | Calhoun et al. |
| 2016/0028379 | A1 * | 1/2016 | Tsubota ................ H03K 5/151 327/291 |
| 2019/0288693 | A1 * | 9/2019 | Gupta .................. H03L 7/0992 |

OTHER PUBLICATIONS

International Search Report & Written Opinion dated Nov. 8, 2018, for PCT Patent Application No. PCT/US2018/040349.

Non-Final Office Action notified Apr. 27, 2020 for U.S. Appl. No. 16/605,492.

Notice of Allowance notified Aug. 10, 2020 for U.S. Appl. No. 16/605,492.

Extended European Search Report dated Feb. 23, 2021 for EP Application No. 18827849.3, 8 pages.

* cited by examiner

APPARATUS AND METHOD FOR IMPROVING LOCK TIME

CLAIM OF PRIORITY

This application is a Continuation of, and claims the benefit of priority to U.S. patent application Ser. No. 16/605,492, filed Oct. 15, 2019, now issued as U.S. patent Ser. No. 10/868,523 on Dec. 15, 2020, which is a National Phase Application of, and claims the benefit of priority to PCT Patent Application No. PCT/US18/40349, filed Jun. 29, 2018, which claims benefit of priority of U.S. Provisional Patent Application No. 62/530,063, filed Jul. 7, 2017, which is incorporated by reference in its entirety for all purposes.

BACKGROUND

In clocking systems using ring-oscillator based phase-locked loops, multi-band oscillators are commonly used to trade-off power, dynamic range, and tuning range for temperature drift. However, existing clocking sources have long lock times which increases latency of entering/existing to and from low power states.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figures 1A, 1B:
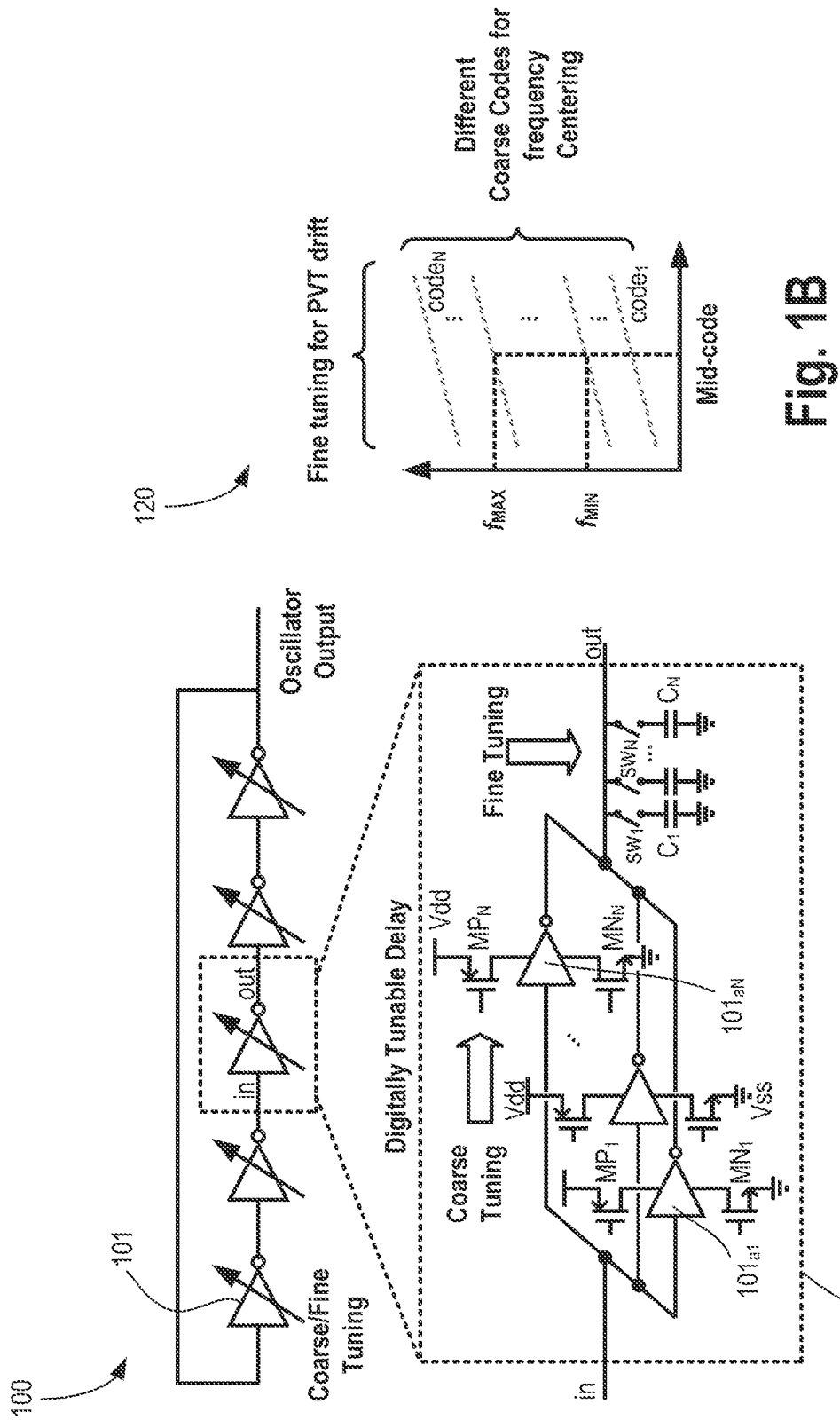
FIG. 1A illustrates a ring oscillator capable of coarse/fine delay tuning, according to some embodiments.
FIG. 1B illustrates a plot showing frequency versus code for different coarse and fine tuning, according to some embodiments.

To save power, a narrow tuning range for a ring oscillator of a phase locked loop (PLL) is desired with just enough range to cover voltage and temperature (e.g., −40 to 125° C.) drifts. To cover the wide frequency ranges, coarse tuning is used depending on applications. For instance, the coarse tuning range for core clocking for a processor such as a general processor can range from 1.6 GHz to 4.0 GHz while the fine range can be +/−10%. Here, the term "coarse code" refers to a digital code for calibrating or tuning an electrical parameter such as propagation delay through a circuit element by a rough amount. Conversely, the term "fine code" refers to a digital code for calibrating or tuning the electrical parameter by a smaller amount than the rough amount used by the coarse code. Generally, a coarse code is applied to a circuit element before a fine code is applied. The term "tuning" or "calibrating" with reference to coarse/fine attributes generally refers to adjusting the values of the coarse or fine code(s). Here, the term "code" refers to a digital signature of two or more bits.

Calibrating coarse/fine tuning of a ring oscillator to select the right or target frequency band may directly affect lock time of a phase locked loop PLL (or frequency locked loop FLL). Lock time is a performance parameter that indicates when a PLL or FLL has acquired phase and/or frequency lock relative to a reference clock. Generally, when the PLL is declared lock, the downstream logic can safely use the output of the PLL. Lock time may impact how frequent a system can enter a low power mode (e.g., sleep state) and back to an active mode (e.g., operating state) for power saving. For example, operating state or active state is declared after the PLL declares a successful lock. In some low power states, the PLL supply voltage is reduced or turned off which in turn results in the PLL losing lock. To reacquire lock, the PLL has to start phase and frequency adjustment till it acquires lock again. This process is time consuming and directly impacts how quickly a processor can enter an operational state from a low power state.

When tuning process of adjusting coarse/fine codes is sped up to improve lock time, it may result in accuracy penalty. Inaccuracy in frequency tuning due to the speeding up of coarse/fine calibration may result in long lock time (e.g., cycle slipping) or failure to lock in extreme cases.

Various embodiments improve lock time through multi-phase frequency measurement. Some embodiments describe an apparatus which shortens frequency measurement time at the same accuracy (as in the case of long or traditional frequency measurement time) by exploiting the intermediate phases available in a ring oscillator. For example, the intermediate phases from various delay stages or elements in a ring oscillator are monitored to determine the frequency of the oscillator. This information of frequency from the intermediate phases is then used to calibrate the coarse code, which results in adjusting the oscillator frequency faster towards a target frequency. After a coarse code is determined, the fine code is adjusted to fine tune the oscillator frequency to reach the target or desired frequency. Some embodiments show lock time improvement directly proportional to the number of stages in the ring oscillator. As lock time is dominated by coarse tuning, shortened frequency measurement time can directly shorten the lock time in a PLL. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For the purposes of the present disclosure the terms "spin" and "magnetic moment" are used equivalently. More rigorously, the direction of the spin is opposite to that of the magnetic moment, and the charge of the particle is negative (such as in the case of electron).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 3:
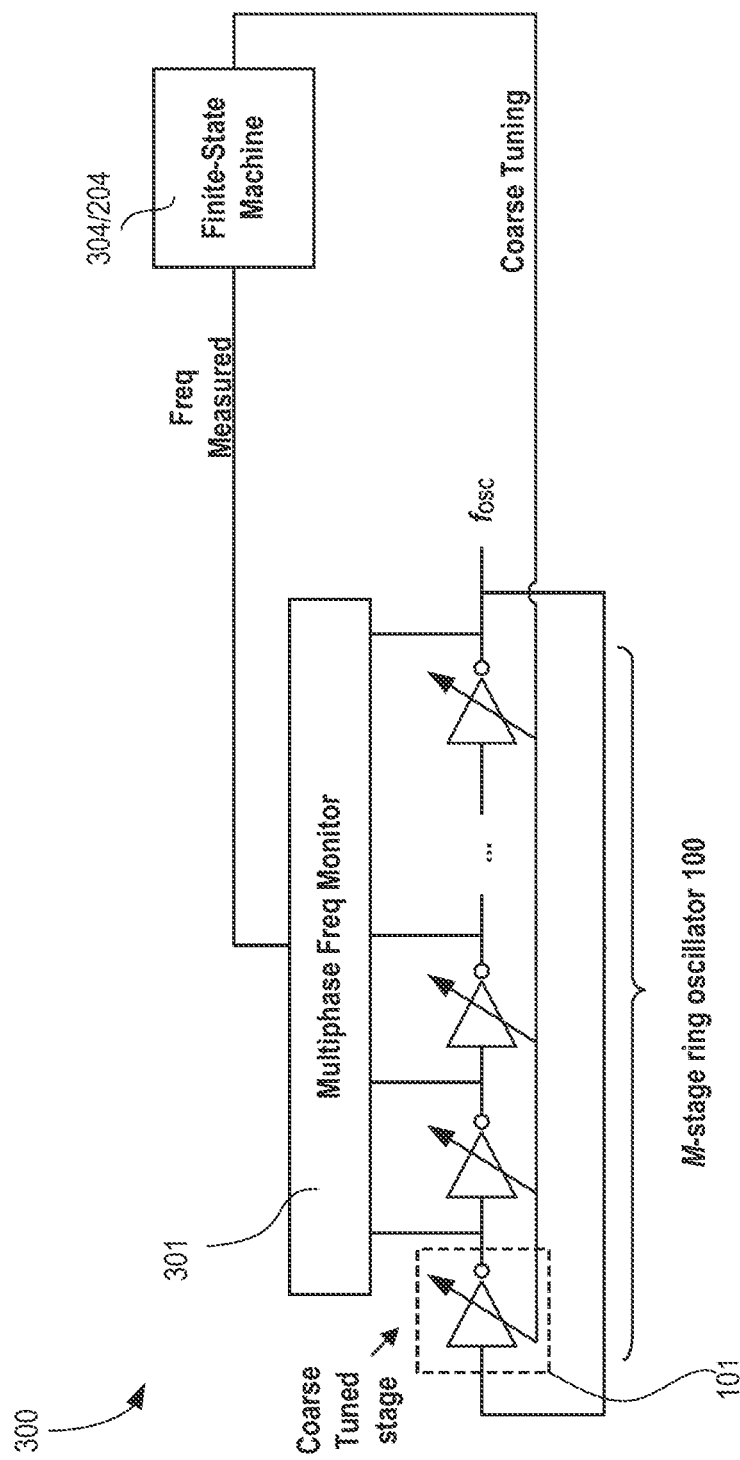
FIG. 3 illustrates a clocking system with a multi-phase frequency measurement apparatus coupled to a ring oscillator, according to some embodiments of the disclosure.

It is pointed out that those elements of FIG. 3 having the same reference numbers (or names) as the elements of any other figure can operate or function in any manner similar to that described, but are not limited to such.

FIG. 1A illustrates a ring oscillator 100 capable of coarse/fine delay tuning, according to some embodiments. FIG. 1A shows an example of the coarse/fine-tuned architecture in which the coarse tuning sets the frequency target, and fine tuning adjusts the frequency via capacitive tuning based on operation environment.

In this example, ring oscillator 100 has five delay stages or elements 101. Each delay stage includes circuit knobs to tune its propagation delay (e.g., delay from input "in" to output "out") by coarse amount and a fine amount. In some embodiments, a delay stage 101 comprises a plurality of inverters (e.g., $101_{a1}$ through $101_{aN}$) that are coupled to one another in parallel and can be enabled or disabled to increase or decrease the driving strength of the delay stage. In some embodiments, each inverter (e.g., $101_{a1}$) can be enabled or disabled by turning on or turning off devices MP and MN coupled to the inverter. These devices receive a coarse code which determines which devices to turn on or off, and thus which inverters are enabled. Here, the coarse tuning devices are $MP_1$ through $MP_N$ and $MN_1$ through $MN_N$. These devices are coupled in series with the transistors of the inverter. For example, the p-type transistor of the inverter is coupled in series with the MP device, while the n-type transistor of the inverter is coupled in series with the MN device. In some embodiments, fine tuning is performed by capacitive devices $C_1$ through $C_N$ which are coupled to the output "out" of the delay stage using controllable switches $SW_1$ through $SW_N$. The fine code is applied to the switches $SW_1$ though $SW_N$, which couples or decouples the capacitive devices to the output node.

In some embodiments, the switches $SW_1$ through $SW_N$ are implemented as devices such as n-type transistor, p-type transistor, or a combination of both. In some embodiments, the capacitive devices are implemented as transistors configured as capacitors, metal capacitors, or a hybrid of transistors and metal capacitors. The various embodiments are not limited to a specific architecture of a ring oscillators. For example, instead of coarse tuning devices are $MP_1$ through $MP_N$ and $MN_1$ through $MN_N$, each delay stage of a ring oscillator may comprise large capacitive devices for coarse turning and smaller capacitive devices for fine tuning which can be added to an output node using digitally controlled switches. While ring oscillator 100 is illustrated with five delay stages, it can have at least two delay stages at minimum coupled together in a ring formation. The maximum number of delay stages can be based on target frequency requirements.

FIG. 1B illustrates a plot 120 showing frequency verses code for different coarse and fine tuning, according to some embodiments. The plot shows that coarse setting selects the main frequency range as identified by codes $code_1$ through $code_N$, and then the fine tuning achieves the operating frequency target for a selected coarse code to compensate for drift in process, voltage, and temperature (PVT). As mentioned above, PLL lock time performance is directly impacted by the selection of coarse/fine codes. For example, slowly selecting a target coarse code for a target frequency may slow down the PLL lock time. Conversely, trying to quickly select a coarse code may result in PLL loop stability issues and other inaccuracies.

Figure 2:
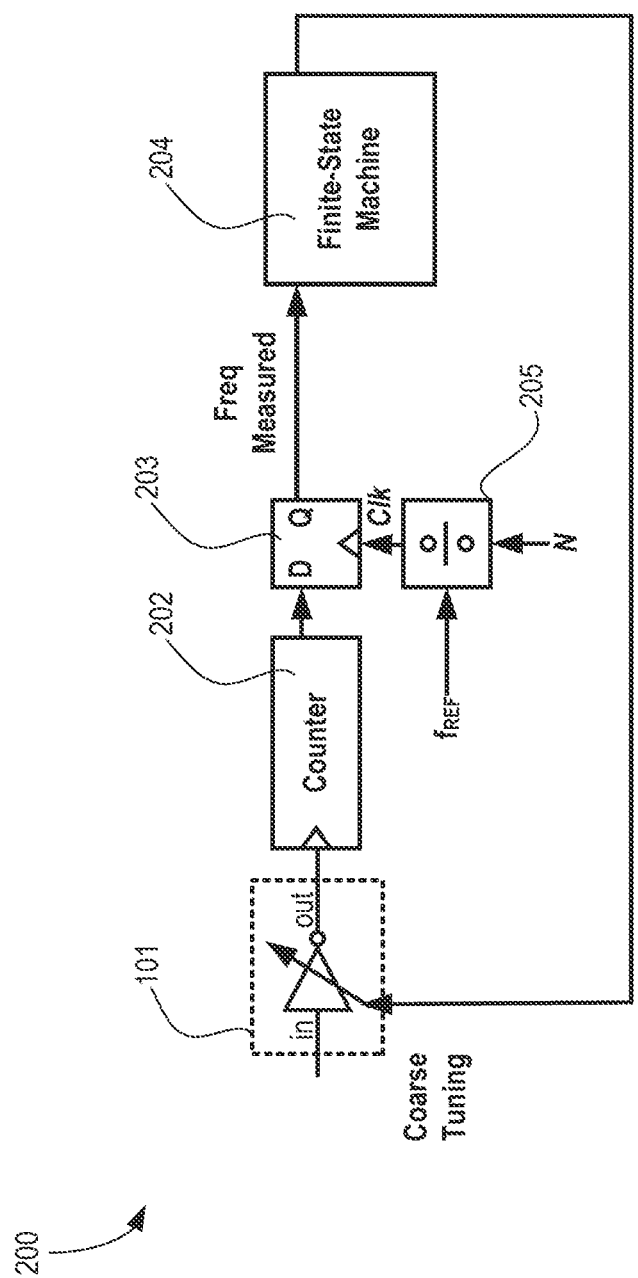
FIG. 2 illustrates a counter-based frequency measurement apparatus, according to some embodiments of the disclosure.

FIG. 2 illustrates a counter-based frequency measurement apparatus 200, according to some embodiments of the disclosure. In some embodiments, circuitries of apparatus 200 are coupled to each delay stage of oscillator 101. For example, the output of delay stage 101 of oscillator 100 is coupled to counter 202, and an output of another delay stage 101 of oscillator 100 is coupled to another counter 202 (not shown). In some embodiments, counter 202 is an up counter which counts the rising and/or falling edges of the signal at the node "out" of a delay stage coupled to the counter. As such, counter 202 determines a frequency of the output of a delay stage. In other embodiments, counter 202 may be a down counter which counts down from a known value. Any suitable implementation of a counter can be used for realizing counter 202.

In some embodiments, the output of counter 202 is sampled by a flip-flop 203, where flip-flop 203 uses a slower clock than a reference clock for the PLL. For example, a divider 205 is provided which divides the reference clock RefClk by a factor 'N' and provides a divided clock Clk to flip-flop 203 for sampling the output of counter 202. By using a divided clock to sample the output of counter 202, a filtering mechanism is introduced. As such, a more accurate frequency is determined. The output of flip-flop 203 is the measured frequency of the signal generated by a delay stage of an oscillator.

In various embodiments, a finite state machine (FSM) 204 is provided which receives measured frequency data from outputs of two or more delay stages of a ring oscillator and uses that data to determine an average frequency. FSM 204 then compares the average frequency with a target frequency to determine whether to increase or decrease the value of the coarse code. The coarse code is then provided to all delay stages of the ring oscillator for coarse tuning. In one example, the measurement accuracy is $2/N(f_{REF})$, where $f_{REF}$ is the frequency of a reference clock. In a ring oscillator with smallest band separation of 20 MHz, the required accuracy is 10 MHz. Using a 100 MHz reference clock, N is 20. With binary search algorithm on a 10 bit coarse tuning design, it would cost 200 clock cycles to find an optimal frequency band. This may result in 2 microseconds of lock time overhead. In some embodiments, FSM 204 applies the flowchart of FIG. 7 to realize the fast locking architecture.

FIG. 3 illustrates a clocking system 300 with a multi-phase frequency measurement apparatus 301 coupled to ring oscillator 100, according to some embodiments of the disclosure.

By tapping the intermediate nodes of the oscillator 100, more edges (information) are available. In some embodiments, the multiphase frequency monitor 301 has a structure as shown in FIG. 2 (minus the FSM 204 and oscillator delay stage) for each delay stage. By tapping into different phases, frequency measurement accuracy is improved by a factor of M. For example, for the same number of reference clock cycles, the improved accuracy is $(2/(MN))f_{REF}$. To achieve the same accuracy, as described above, the lock time is reduced by a factor of M, in accordance with some embodiments. In some embodiments, results from various counters, coupled to their corresponding delay stage tap, is averaged by FSM 304/204. The average results improve accuracy.

To illustrate how accuracy is improved, assume the oscillation frequency ($f_{OSC}$) is 40.4 $f_{REF}$. In the original scheme where the final output of the oscillator 100 is counted, the ideal measurement results is "41" after 1 reference clock cycle. However, in FIG. 3, the results are [41 41 40 40 40] assuming a 5-stage oscillator is used and frequency is counted at the output of each delay stage. The averaged result is "40.4". By tapping different phases, fractional accuracy is improved. Further optimization can be done by measuring the rising and falling edges, thereby reducing coarse lock time by 2×, resulting in 10× lock time saving, for example. As such, lock times for processors improve thereby improving system responsiveness. Improving system responsiveness maximizes the opportunity to enter low power state with clock shut down.

Figure 4:
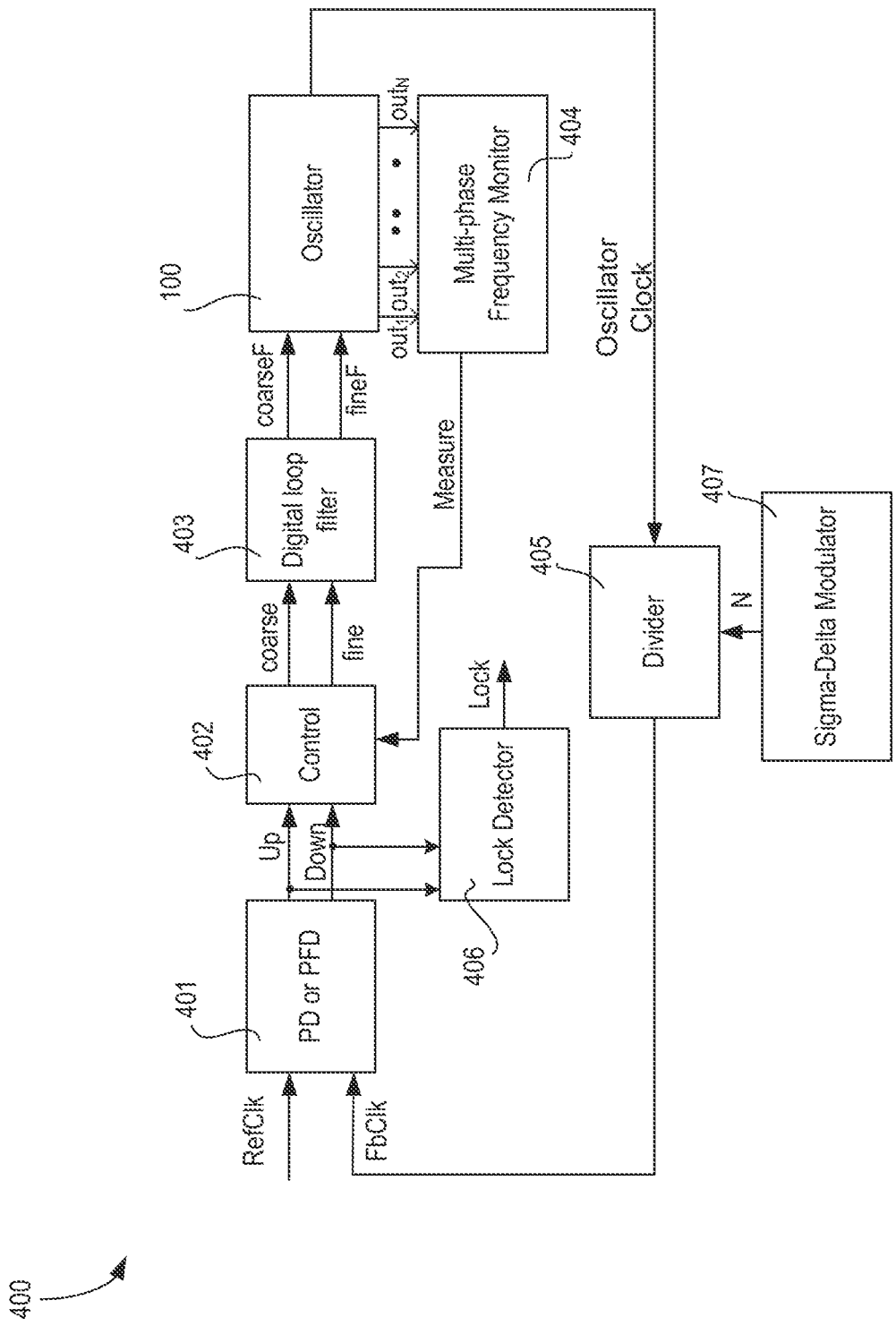
FIG. 4 illustrates a phase locked loop (PLL) having the apparatus for improving lock time, according to some embodiments of the disclosure.

FIG. 4 illustrates a phase locked loop (PLL) 400 having the apparatus for improving lock time, according to some embodiments of the disclosure. In some embodiments, PLL 400 comprises a phase detector (PD), phase frequency detector (PFD), or a time-to-digital converter (TDC) 401, control machine 402, digital loop filter (DLF) 403, oscillator 100, multi-phase frequency monitor 404, divider 405, lock detector 406, and sigma-delta modulator 407 coupled together as shown. The PD, PFD 401 generates Up/Down pulses or signals according to phase difference between reference clock (RefClk) and feedback clock (FbClk). A PD is a circuitry that generates Up and Down signals that represent phase difference between RefClk and FbClk. A PFD can generate Up and Down pulses that contain phase and frequency difference between RefClk and FbClk.

The control machine 402 receives the Up/Down pulses and generates digital codes for coarse and fine tuning. The digital codes are then filtered by a digital loop filter (DLF). The outputs of the DLF are coarseF and fineF which are used to adjust the delay of each delay stage of the oscillator 100. The divider 405 receives the output "Oscillator Clock" of the oscillator 100 and divides it down to generate feedback clock (FbClk). In some embodiments, a sigma-delta modulator 407 is used to generate the divider ratio N for the divider. The divider ratio N can be an integer or a fraction.

Here, two feedback loops are shown. The first feedback loop is a short loop and includes control machine 402, DLF 403, Oscillator 100, and Multi-phase frequency monitor 404. The second feedback loop is a longer loop and includes PD or PFD, 401, control machine 402, DLF 403, Oscillator 100, and Divider 405. In some embodiments, the first feedback loop is enabled when the PLL wakes up from reset or a low power state that requires the PLL to relock. The first feedback loop is used to quickly determine a coarse code that brings the oscillator output to be close to a target frequency. In the first feedback loop, the divider 405 and PFD 401 are bypassed to achieve faster response. In one such embodiment, the outputs Up and Down from PFD 401 are ignored by Control machine 402, and the output Measure from Multi-phase frequency monitor 404 is used to determine the coarse code. In some embodiments, the digital loop filter 403 may also be bypassed in the first feedback loop.

In some embodiments, the multi-phase frequency monitor 404 monitors the frequency at the outputs $out_1$ through $out_N$ of each delay stage of the oscillator 100 and determines the frequency of the clock at the output of each delay stage. The frequency from each delay stage is then averaged by FSM 304 (which here is part of multi-phase frequency monitor 404), and that averaged output is Measure. The output Measure is then received by the control machine 402 that adjusts coarse and/or fine codes to speed up the lock time. The lock detector outputs the lock indicator according to the up/down signals and/or the reference clock (RefClk) and feedback clock (FbClk).

After FSM 304 determines that oscillator clock frequency is close a target frequency (e.g., within 10%), then the first feedback loop is disabled and the second feedback loop is enabled. For example, control machine 402 now uses Up and Down signals to control the coarse and fine codes and bypasses the output Measure. This switching mechanism can be implemented by a multiplexer (not shown). Since the coarse code is already determined by the first feedback loop, the second feedback loop performs the fine tuning using the coarse code generated by the first feedback loop.

In some embodiments, the PD or PFD 401 is replaced with a time to digital converter (TDC) 401 that generates a digital bit stream indicating phase error between RetClk and FbClk. The digital bit stream replaces the Up/Down signals. A TDC is a circuit converting the phase error between RefClk and FbClk into a digital output. The digital output can be in the form of Up/Down signals or encoded in other formats. These other formats may comprise output(s) that can be a real number representing phase error. For example, the real number may indicate RefClk is leading FbClk by 10 ps. In another example, the other format may indicate a number such as the RefClk is leading the FbClk (e.g., output=1) or RefClk is lagging FbClk (e.g., output=0).

In some embodiments, lock detector 406 receives the digital output TDC 401 to determine when to indicate a lock. For example, when the digital output indicates an error below a threshold (e.g., predetermined or programmable), Lock Detector 406 then indicates a lock. In some embodiments, when the first feedback loop is enabled, Control machine 402 ignores the output of TDC 401 and uses the output Measure to adjust the coarse code (which is then filtered by the Digital loop filter 403). Once the target coarse code is determined, the first feedback loop is disabled and Control machine 402 then uses the digital output of TDC 401 to adjust the fine code.

Figure 5:
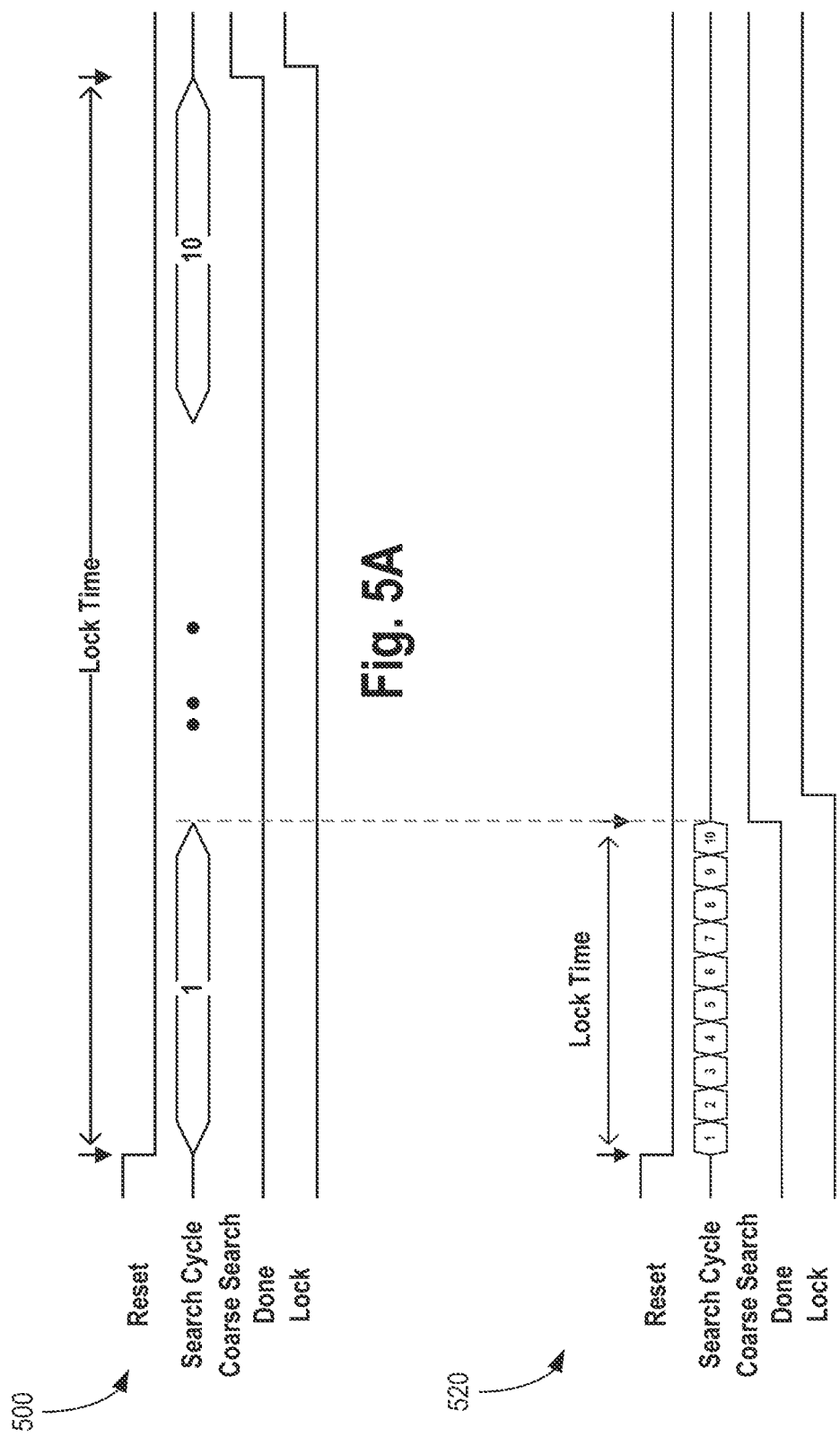
FIG. 5A illustrates a timing diagram showing lock time for a traditional PLL.
FIG. 5B illustrates a timing diagram showing reduced lock time for a PLL using the multi-phase frequency measurement apparatus, in accordance with some embodiments.

FIG. 5A illustrates a timing diagram 500 showing lock time for a traditional phase locked loop. FIG. 5B illustrates a timing diagram 520 showing reduced lock time for a phase locked loop using the multi-phase frequency measurement apparatus, in accordance with some embodiments. In timing diagram 500, lock time begins after Reset (e.g., the signal that causes the PLL to begin to lock). After reset, the PLL uses its traditional feedback loop to determine the coarse code. Once the coarse code is determined, the "done" signal is asserted and the fine code is set for eventual lock of the PLL. In timing diagram 500, the search from coarse code begins right after reset using the short feedback loop. As such, the coarse code is determined much faster (e.g., 10 times faster) than in the traditional case of timing diagram 500. Once the coarse code is determined, the signal "done" is asserted and the first feedback loop (or the short feedback loop) is disabled and the second feedback loop (or normal long feedback loop) is enabled to determine the fine code. Once the fine code is set (e.g., within a margin of tolerance), lock signal is asserted.

Figure 6:
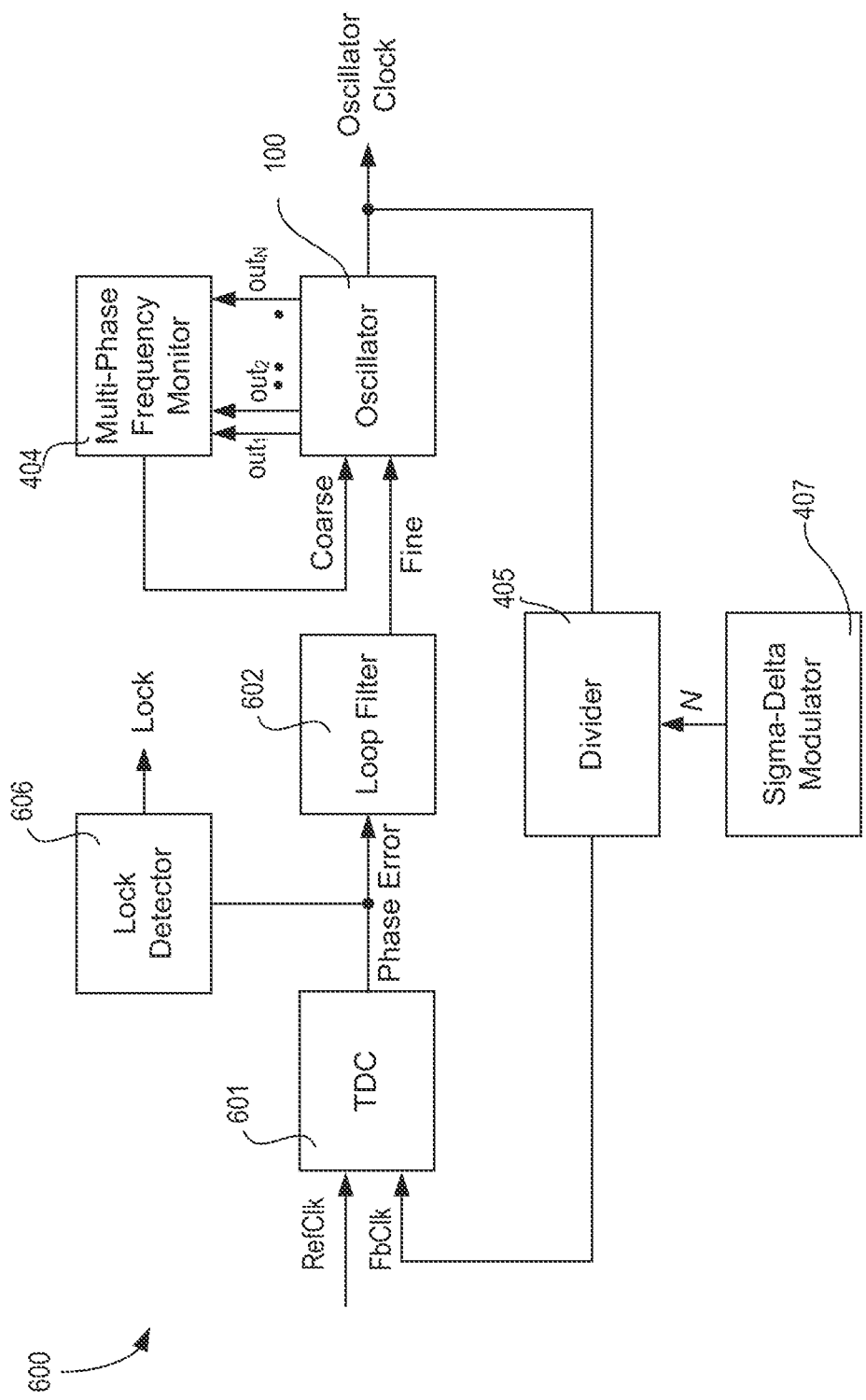
FIG. 6 illustrates a PLL with apparatus for improving lock time, according to some embodiments of the disclosure.

FIG. 6 illustrates a PLL 600 with apparatus for improving lock time, according to some embodiments of the disclosure. PLL 600 comprises PD, PFD or TDC 601, loop filter 603, oscillator 100, multi-phase frequency monitor 404, divider 405, lock detector 606, and sigma-delta modulator 407. The PD, PFD, or TDC 601 generates phase error according to phase difference between the reference clock (RefClk) and feedback clock (FbClk). As discussed with reference to FIG. 4, when PD, PFD is used, Up and Down pulses or signals are generated to indicate phase error. Likewise, when TDC 601 is used, a digital bit stream is generated to indicate the phase error. In FIG. 6, TDC 601 is used to illustrate the apparatus.

The loop filter 602 filters the phase error and generates a fine code. In this case, the coarse code is determined prior to the fine code set within its tolerance levels. Compared to FIG. 4, here, the first feedback loop is much shorter and is used to determine the coarse code. The first feedback loop comprises oscillator 100 and multi-phase frequency monitor 404. The second feedback loop comprises PD or TDC 601, loop filter 602, oscillator 100, and divider 405. In this embodiment, the coarse code does not pass through the loop filter 602. Once the coarse code is determined, the first feedback loop is disabled and the coarse code is locked. The PLL then uses the traditional long loop (or second loop) to adjust the fine code. When the fine code is close to a predetermined tolerance level, the phase error is small enough for the clock detector 606 to declare lock.

Figure 7:
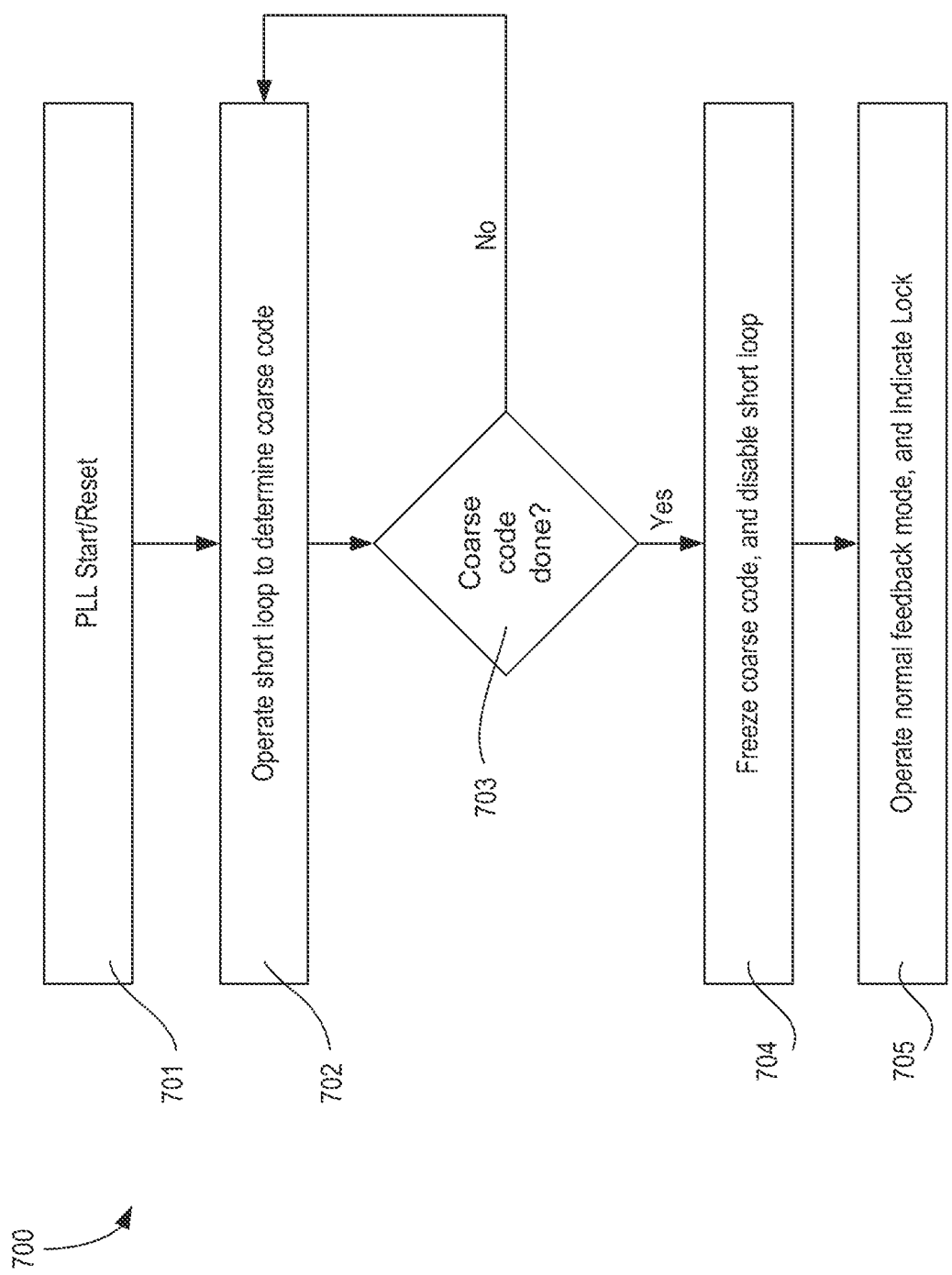
FIG. 7 illustrates a flowchart of a method for reducing lock time, in accordance with some embodiments.

FIG. 7 illustrates flowchart 700 of a method for reducing lock time, in accordance with some embodiments. At block 701, PLL starts to lock (e.g., after reset, after clock power down). At block 702, the first feedback loop (or short loop) is enabled to determine a coarse code. At block 703, FSM 304 determines whether the coarse code results in an oscillation frequency closer to the target frequency. For example, the coarse code which results in the target frequency being substantially in the middle of the range of the coarse code is selected as shown in FIG. 1B. If the coarse code is still far out, and the propagation delay of the delay stages need to be further adjusted by the coarse code, the process continues to block 702 and another coarse code is selected. In another embodiment, when the target frequency is about in a middle of a range of the coarse code, the coarse code is frozen as indicated by block 704. The process then continues to block 705 where the second feedback loop (or the normal feedback mode) is enabled and the fine code is set. The PLL declares lock when the fine code dithers around the target frequency.

Figure 8:
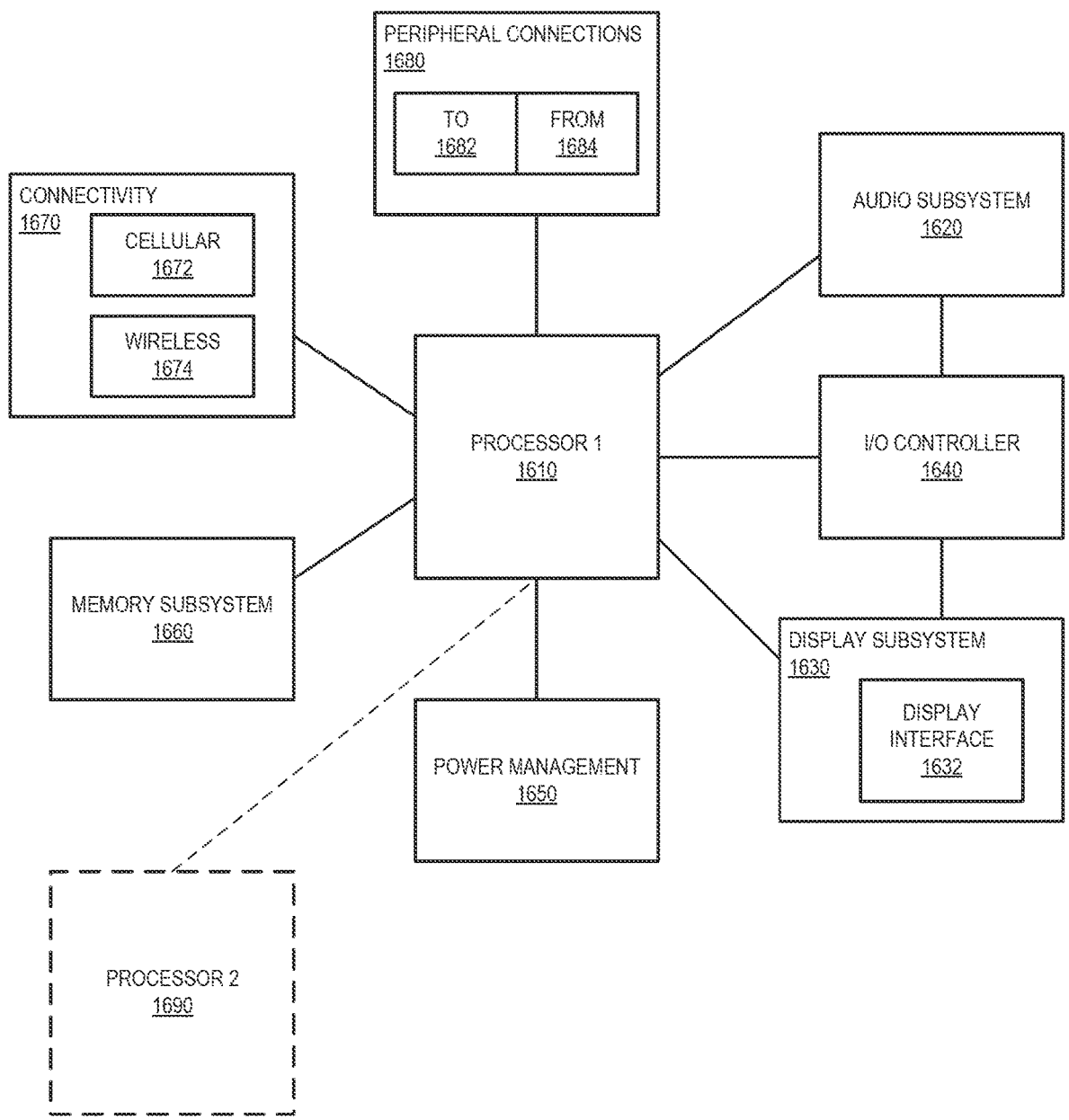
FIG. 8 illustrates a smart device or a computer system or a SoC (System-on-Chip) having apparatus for improving lock time, according to some embodiments of the disclosure.

FIG. 8 illustrates a smart device or a computer system or a SoC (System-on-Chip) having apparatus for improving lock time, according to some embodiments of the disclosure. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having an apparatus for improving lock time, according to some embodiments discussed. Other blocks of the computing device 1600 may also include an apparatus for improving lock time, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: an oscillator comprising at least two delay circuitries coupled together in a ring formation, wherein each delay circuitry has an adjustable propagation delay; a first counter coupled to an output of a first delay circuitry of the at least two delay circuitries; and a second counter coupled to an output of a second delay circuitry of the at least two delay circuitries, wherein delay of the at least two delay circuitries is adjusted according to outputs of the first and second counters.

Example 2

The apparatus of example 1, wherein each delay circuitry includes a first circuitry to control a first delay of the delay circuitry, and a second circuitry to control a second delay of the delay circuitry, wherein the first delay is larger than the second delay.

Example 3

The apparatus of example 1 comprises: a first sequential circuitry coupled to an output of the first counter; and a second sequential circuitry coupled to an output of the second counter.

Example 4

The apparatus of example 3 comprises a divider coupled to the first and second sequential circuitries, wherein the divider is to provide a clock to sample inputs of the first and second sequential circuitries.

Example 5

The apparatus of example 1 comprises logic to generate an average of outputs of the first and second sequential circuitries.

Example 6

The apparatus of example 1 comprises a divider coupled to an output of the oscillator.

Example 7

The apparatus of example 6 comprises a one of a phase detector, phase frequency detector, or time-to-digital converter coupled to an output of the oscillator.

Example 8

The apparatus of example 7 comprises a lock detector coupled to an output of the phase frequency detector.

Example 9

The apparatus of example 8 comprises a loop filter to receive an output of the phase frequency detector, wherein an output of the loop filter is coupled to the oscillator.

Example 10

The apparatus of example 9, wherein the output of the loop filter is to adjust delay of each delay circuitry by a first delay amount, wherein the outputs of the first and second counters is to adjust the delay of each delay circuitry by a second delay amount, and wherein the first delay amount is shorter than the second delay amount.

Example 11

An apparatus comprising: a ring oscillator including at least two delay stages, wherein each delay stage has a controllable delay; and a multiphase frequency monitor coupled to the ring oscillator to monitor frequency at an output of at least two delay stages of the ring oscillator.

Example 12

The apparatus of example 11, wherein the multiphase frequency monitor comprises at least two counters to count respective frequencies of the at least two delay stages.

Example 13

The apparatus of example 11 comprises logic to generate an average frequency based on the respective frequencies of the at least two delay stages.

Example 14

The apparatus of example 13, wherein the logic is to adjust delay of the at least two delay stages of the ring oscillator according to the average frequency.

Example 15

The apparatus of example 11, wherein each delay stage includes a first circuitry to control a first delay of the delay stage, and a second circuitry to control a second delay of the delay stage, wherein the first delay is larger than the second delay.

Example 16

The apparatus of example 11, wherein the ring oscillator is part of a phase locked loop.

Example 17

A system comprising: a memory; a processor coupled to the memory, wherein the processor comprises a phase locked loop which includes an apparatus according to any one of examples 1 to 10; and a wireless interface to allow the processor to communicate with another device.

Example 18

A system comprising: a memory; a processor coupled to the memory, wherein the processor comprises a phase locked loop which includes an apparatus according to any one of examples 11 to 15; and a wireless interface to allow the processor to communicate with another device.

Example 19

An apparatus comprising: means for enabling a first electrical loop comprising an oscillator and a multi-phase monitor coupled to the oscillator; means for determining a first code to adjust propagation delay of delay circuits of the oscillator, wherein the first code is determined according to one or more outputs of the multi-phase monitor; means for applying the first code to the delay circuits; means for freezing the first code when a lock indicator indicates that a frequency of the oscillator is substantially close to a target frequency; means for disabling the first electrical loop; and means for enabling a second electrical loop comprising a divider, phase detector, filter, and the oscillator, wherein the second electrical loop is to provide a second code to the oscillator to adjust the delay of the delay circuits.

Example 20

The apparatus of example 19 comprises means for monitoring phase error and determining whether to increase or decrease a value of the second code.

Example 21

A method comprising: enabling a first electrical loop comprising an oscillator and a multi-phase monitor coupled to the oscillator; determining a first code to adjust propagation delay of delay circuits of the oscillator, wherein the first code is determined according to one or more outputs of the multi-phase monitor; applying the first code to the delay circuits; freezing the first code when a lock indicator indicates that a frequency of the oscillator is substantially close to a target frequency; disabling the first electrical loop; and enabling a second electrical loop comprising a divider, phase detector, filter, and the oscillator, wherein the second electrical loop is to provide a second code to the oscillator to adjust the delay of the delay circuits.

Example 22

The method of example 21 comprises monitoring phase error and determining whether to increase or decrease a value of the second code.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A frequency or phase locked loop comprising:
   a phase detector or a phase frequency detector to receive a reference clock and a feedback clock;
   a divider coupled to the phase detector or the phase frequency detector, wherein the divider is to generate the feedback clock;
   an oscillator coupled to the divider, wherein the oscillator comprises at least two delay stages coupled together in a ring formation, wherein each delay stage has an adjustable propagation delay; and
   a frequency monitor coupled to the at least two delay stages, wherein the frequency monitor is to determine a frequency of a signal at an input and/or an output of the at least two delay stages, wherein the frequency monitor comprises:
   a first counter coupled to the output of a first delay stage of the at least two delay stages; and
   a second counter coupled to the output of a second delay stage of the at least two delay stages.

2. The frequency or phase locked loop of claim 1, further comprising a circuitry to adjust delay of the at least two delay stages according to outputs of the first and second counters.

3. The frequency or phase locked loop of claim 1, further comprising: a first sampler to sample an output of the first counter; and a second sampler to sample an output of the second counter.

4. The frequency or phase locked loop of claim 3, wherein the first sampler and the second sampler sample the output of the first counter and the output of the second counter using a clock which is slower than the reference clock.

5. The frequency or phase locked loop of claim 4, wherein the divider is a first divider and wherein the frequency or phase locked loop further comprises a second divider to divide the reference clock to generate the clock.

6. The frequency or phase locked loop of claim 1, further comprising logic to generate an average frequency based on respective frequencies of the at least two delay stages.

7. The frequency or phase locked loop of claim 6, wherein the logic compares the average frequency with a target frequency to determine whether to increase or decrease a coarse code which is used to increase or decrease the adjustable propagation delay of each delay stage.

8. The frequency or phase locked loop of claim 1, further comprising a lock detector coupled to the phase detector or a phase frequency detector, wherein the lock detector is to monitor one or more outputs of the phase detector orthe phase frequency detector to determine whether the frequency or phase locked loop is phase or frequency locked.

9. The frequency or phase locked loop of claim 1, further comprising a sigma-delta modulator coupled to the divider.

10. A frequency or phase locked loop comprising:
   a time-to-digital converter to receive a reference clock and a feedback clock;
   a divider coupled to the time-to-digital converter, wherein the divider is to generate the feedback clock;
   an oscillator coupled to the divider;
   a circuitry coupled to the oscillator, wherein the circuitry is to tap intermediate nodes of the oscillator to determine frequency of signals at the intermediate nodes; and
   logic to adjust a frequency of the oscillator according to a comparison of an average of the frequency of signals at the intermediate nodes and a target frequency of the oscillator.

11. The frequency or phase locked loop of claim 10, wherein the oscillator includes a plurality of delay stages, wherein the frequency or phase locked loop comprises:
   a first counter coupled to an output of a first delay stage of the plurality of delay stages; and
   a second counter coupled to an output of a second delay stage of the plurality of delay stages.

12. The frequency or phase locked loop of claim 11, further comprising: a first sampler to sample an output of the first counter; and a second sampler to sample an output of the second counter.

13. The frequency or phase locked loop of claim 12, wherein the first sampler and the second sampler sample the output of the first counter and the output of the second counter using a clock which is slower than the reference clock.

14. The frequency or phase locked loop of claim 13, further comprising a second divider to divide the reference clock to generate the clock.

15. The frequency or phase locked loop of claim 10, further comprising a lock detector coupled to the time-to-digital converter, wherein the lock detector is to monitor an output of the time-to-digital converter to determine whether the frequency or phase locked loop is phase or frequency locked.

16. A frequency or phase locked loop comprising:
   a phase detector or a phase frequency detector to receive a reference clock and a feedback clock;
   a divider coupled to the phase detector or the phase frequency detector, wherein the divider is to generate the feedback clock;
   an oscillator coupled to the divider, wherein the oscillator comprises at least two delay stages coupled together in a ring formation, wherein each delay stage has an adjustable propagation delay;
   a frequency monitor coupled to the at least two delay stages, wherein the frequency monitor is to determine a frequency of a signal at an input and/or an output of the at least two delay stages; and
   a sigma-delta modulator coupled to the divider.

* * * * *

UNITED STATES PATENT AND TRADEMARK OFFICE
CERTIFICATE OF CORRECTION

PATENT NO. : 11,387,815 B2
APPLICATION NO. : 17/119937
DATED : July 12, 2022
INVENTOR(S) : William Li, Mohsen Nasroullahi and Khoa Nguyen It is certified that error appears in the above-identified patent and that said Letters Patent is hereby corrected as shown below:

In the Claims

Column 15
Line 6, "… phase detector orthe…" should read -- phase detector or the --

Signed and Sealed this
Sixteenth Day of May, 2023

Katherine Kelly Vidal
*Director of the United States Patent and Trademark Office*